United States Patent [19]
Kim

[11] Patent Number: 5,638,017
[45] Date of Patent: Jun. 10, 1997

[54] PULSE WIDTH MODULATION CIRCUIT

[75] Inventor: Ho H. Kim, Kumi, Rep. of Korea

[73] Assignee: LG Semicon Co., Ltd., Chungcheongbuk-do, Rep. of Korea

[21] Appl. No.: 551,784

[22] Filed: Nov. 7, 1995

[30] Foreign Application Priority Data

Jul. 14, 1995 [KR] Rep. of Korea ............... 1995 20840

[51] Int. Cl.$^6$ ...................................... H02K 7/08
[52] U.S. Cl. ..................... 327/176; 327/34; 327/172; 327/277
[58] Field of Search ...................... 327/152, 153, 327/161, 172, 174, 175, 176, 99, 269, 270, 271, 276, 277, 284, 295, 299, 407, 34

[56] References Cited

U.S. PATENT DOCUMENTS

| | | | |
|---|---|---|---|
| 3,725,672 | 4/1973 | Reuter | 327/176 |
| 4,755,704 | 7/1988 | Flora et al. | 327/153 |
| 4,779,022 | 10/1988 | Skierszkan | 327/175 |
| 4,999,526 | 3/1991 | Dudley | 327/99 |
| 5,065,042 | 11/1991 | Thomsen et al. | 327/99 |
| 5,124,573 | 6/1992 | Wong | 327/172 |
| 5,136,253 | 8/1992 | Ueno | 327/176 |
| 5,204,559 | 4/1993 | Deyhimy et al. | 327/99 |
| 5,208,559 | 5/1993 | Jordan | 327/176 |
| 5,343,082 | 8/1994 | Han et al. | 327/34 |
| 5,406,132 | 4/1995 | Housako | 327/172 |
| 5,438,303 | 8/1995 | Murakami et al. | 327/172 |
| 5,438,550 | 8/1995 | Kim | 327/175 |
| 5,444,403 | 8/1995 | Nagasawa | 327/175 |
| 5,475,322 | 12/1995 | MacDonald | 327/175 |
| 5,532,633 | 7/1996 | Kawai | 327/176 |

*Primary Examiner*—Timothy P. Callahan
*Assistant Examiner*—My-Trang Nu Ton
*Attorney, Agent, or Firm*—Morgan, Lewis and Bockius LLP

[57] ABSTRACT

A pulse width modulation circuit comprises a data register for separating a data pulse signal into a first selection signal and a second selection signal, a delay signal generator for processing the first selection signal and a clock signal to generate a delay signal, and a logic gate circuit for processing the second selection signal, the clock signal, and the clock signal to generate a pulse width modulation data signal.

20 Claims, 4 Drawing Sheets

F I G.3
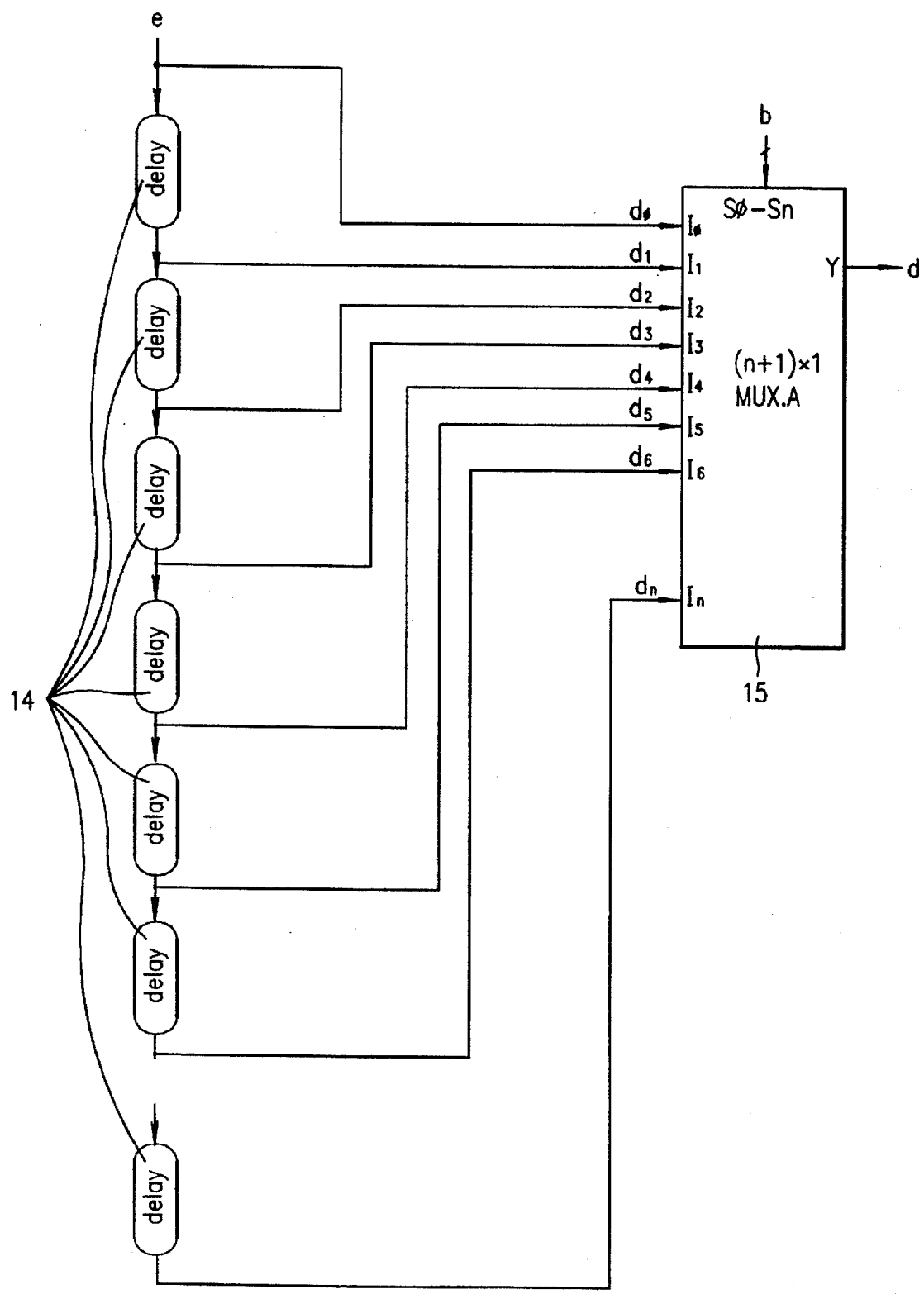

PULSE WIDTH MODULATION CIRCUIT

BACKGROUND OF THE INVENTION

1. Field of the Invention

The present invention relates to a pulse width modulation circuit, and more particularly, to a pulse width modulation (hereinafter referred to as "PWM") circuit for forming a high density pulse width.

2. Description of the Conventional Art

A conventional PWM circuit will be described with reference to FIG. 1. As shown in FIG. 1, a counter 1 receives a signal from a regular clock pulse Z and generates a counter value X which is synchronized to clock Z. A detector 2 detects a counter value X equal to zero that is output from counter 1. A data register 3 stores a determined pulse width data value and generates a pulse width signal Y corresponding to the data value. A comparator 4 compares pulse width signal Y from data register 3 with counter value X from counter 1 to generate a certain output when the values are identical to each other. An R/S flip-flop 5 receives outputs from comparator 4 and detector 2 to generate a pulse width modulation output.

The conventional PWM circuit described above operates as follows. As shown in FIG. 1, a reference clock signal Z is counted by counter 1 so that the result is supplied to detector 2 if the result is zero, and to comparator 4 if the result equals or exceeds one.

Then, the transmitted 'zero' value passes through detector 2 to generate a high signal which, in turn, is supplied to a reset terminal R of R/S flip-flop 5. The transmitted counter value X equalling or exceeding one and a pulse width value Y from data register 3 are compared in comparator 4 to provide the high signal to a set terminal S of R/S flip-flop when the compared values are identical to each other. Thus, the successive switching of R/S flip-flop 5 produces a PWM data signal. At this time, when set signal S of R/S flip-flop 5 is high, an output signal Q is high until the reset signal is received, and output signal Q is instantly changed to low once the reset signal is supplied.

Since the pulse width is modulated by the input clock frequency in the PWM circuit of the conventional technique, the pulse width cannot be flexibly adjusted, and any desired pulse width which is smaller than a minimum reference pulse width cannot be formed. Here, due to the circuitry limitation, it has been heretofore impossible to generate a pulse of high density.

SUMMARY OF THE INVENTION

Accordingly, the present invention is directed to a pulse width modulation circuit that substantially obviates one or more problems due to limitations and disadvantages of the related art.

An object of the present invention to provide a pulse width modulation (PWM) circuit for smoothly adjusting a generated pulse width and generating a pulse of high density while simplifying the circuitry.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, a pulse width modulation circuit of the present invention includes a data register for separating a data pulse signal into a first selection signal and a second selection signal, a delay signal generator for processing the first selection signal and a clock signal to generate a delayed clock signal, and a logic gate circuit for processing the second selection signal, the clock signal, and the delayed clock signal to generate a pulse width modulation data signal.

In another aspect of the present invention, there is provided a pulse width modulation circuit including a data register part for separating a data pulse signal into a first selection signal and a second selection signal and for outputting the result to a delay signal generating circuit. The delay signal generating circuit processes the first selection signal and a clock signal to generate a delay signal. Also, a logic gate processes the second selection signal, clock signal, and delayed clock signal from the delay signal generating circuit to output a pulse width modulation data signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 3 is a detailed block diagram of the delay signal generating section of the pulse width modulation circuit according to the present invention;

DETAILED DESCRIPTION OF THE PREFERRED EMBODIMENT

Reference will now be made in detail to the preferred embodiments of the present invention, examples of which are illustrated in the accompanying drawings.

Figure 1:
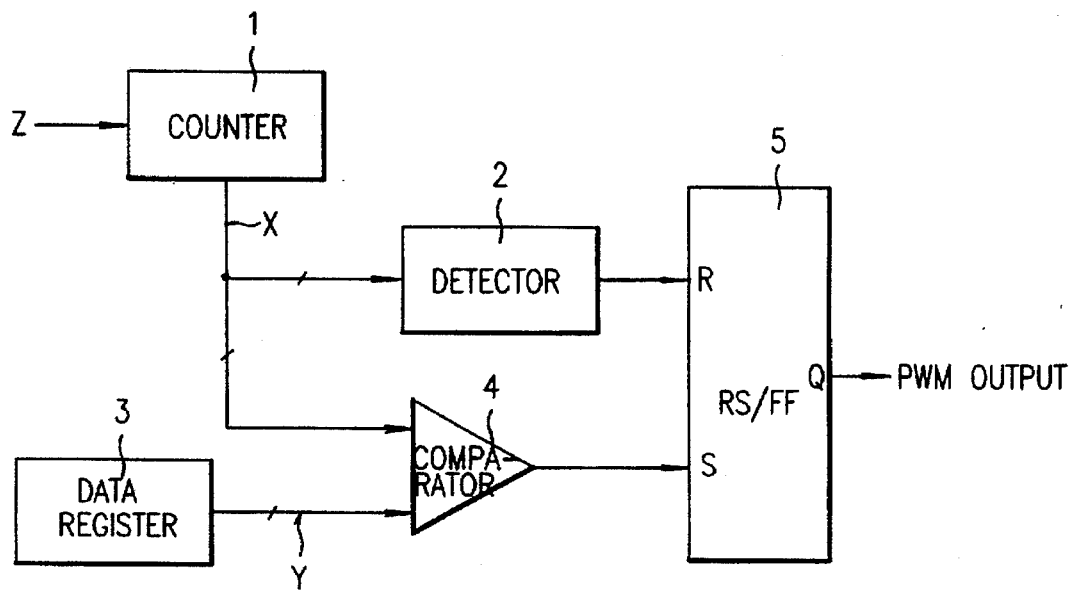
FIG. 1 is a block diagram of a conventional pulse width modulation circuit.
Figure 2:
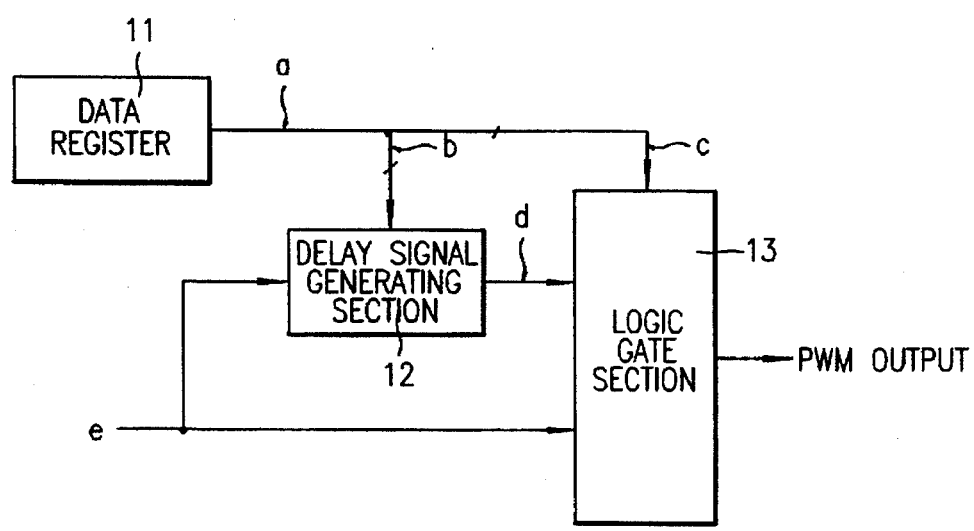
FIG. 2 is a block diagram of a pulse width modulation circuit according to the present invention.
Figure 4:
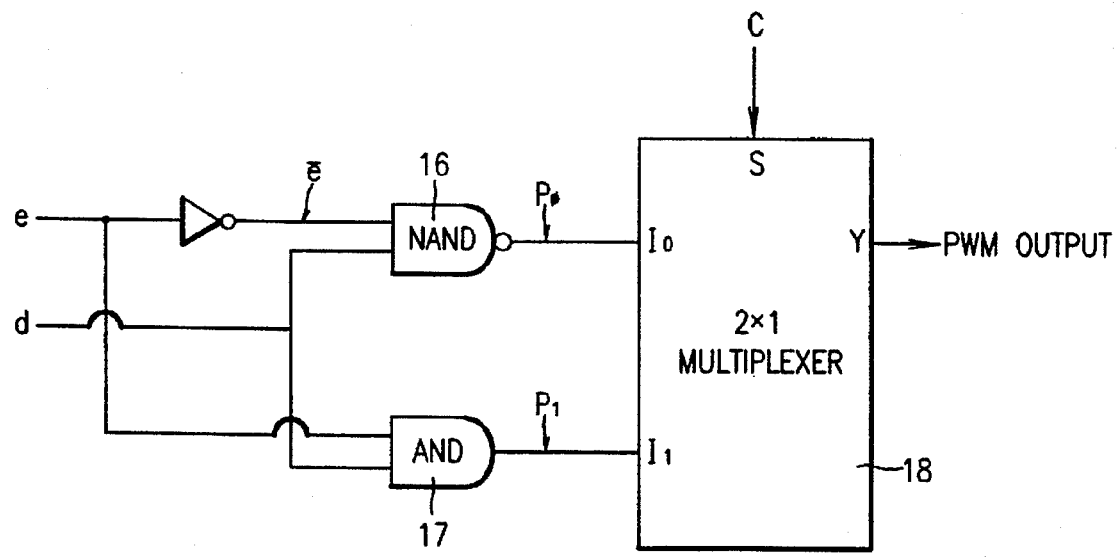
FIG. 4 is a detailed block diagram showing the logic gate section of the pulse width modulation circuit according to the present invention.

As shown in FIGS. 2 to 4, a PWM circuit according to the present invention will be described in detail.

In FIG. 2, the PWM circuit according to the present invention has a data register 11 for storing a pulse width data signal. The most significant bits of the pulse width data signal form a gate selection signal c and the remaining least significant bits form a delay selection signal b. Additionally, a delay signal generating section 12 receives a reference clock signal as an input e and generates a delayed clock signal d in accordance with a value of delay selection signal b. A logic gate section 13 receives reference clock signal e and delayed clock signal d as two of the inputs and, in accordance with gate selection signal c, provides a PWM data signal.

Delay signal generating section 12, as shown in FIG. 3, may include a unit delay circuit 14 for sequentially delaying reference clock signal e n-times to supply n+1 delay signals $d_0$ to $d_n$ to a multiplexer 15. Multiplexer 15, for example, an (n+1)×1 multiplexer, processes the n+1 delay signals $d_0$ to $d_n$ from unit delay circuit 14 and selects any one of the delayed clock signals in accordance with delay selection signal b.

Logic gate section 13, as shown in FIG. 4, includes a NAND gate 16 for performing a NAND operation on a signal obtained by inverting reference clock signal e and delayed clock signal d, which is the output signal from multiplexer 15. Reference clock signal e and delayed clock signal d output from multiplexer 15 are supplied to AND gate 17. A two-input multiplexer 18 (e.g., a 2×1 multiplexer) receives the signals output from NAND gate 16 and AND gate 17 through two input terminals $I_0$ and $I_1$. Gate selection signal c, formed of the most significant bits of the output from data register 11, is supplied to a strobe terminal S of the two-input multiplexer 18. The two-input multiplexer 18 generates the PWM data signal based on the inputs $I_0$ and $I_1$, and the input to strobe terminals.

Figure 5:
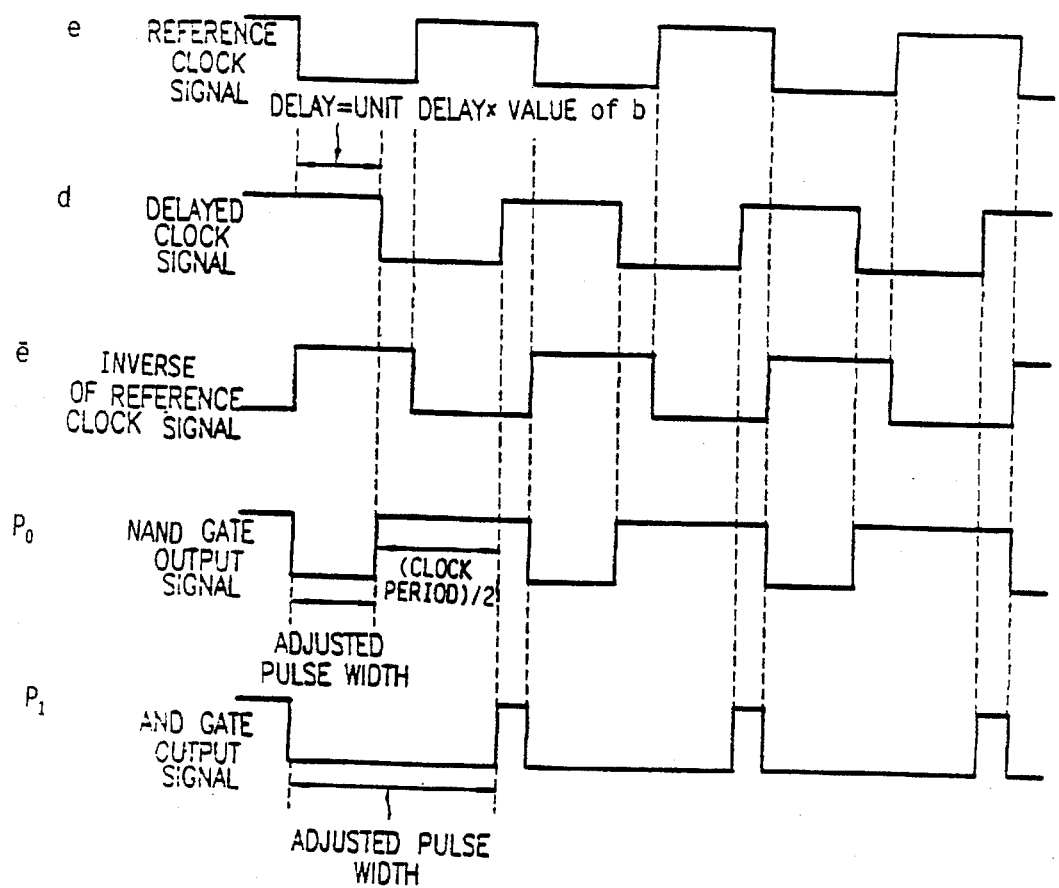
FIG. 5 is a graph of operational waveforms of the pulse width modulation circuit according to the present invention.

Hereinafter, an operation of the PWM circuit according to the present invention constructed as above will be described in detail. As illustrated in FIG. 5, which shows operational waveforms of the PWM circuit according to the present invention, a pulse width data signal generated from data register is separated into delay selection signal b and gate selection signal c to be respectively supplied to the delay signal generating section 12 and logic gate section 13. Then, the unit delay circuit 14 generates n+1 delay signals $d_0$ to $d_n$ by delaying reference clock signal e as many as N times (where N=0, 1, ... n). The n+1 delay signals $d_0$ to $d_n$ are supplied to input terminals $I_0$ to $I_n$ of n+1 multiplexer 15. Here, any one of the n+1 delay signals $d_0$ to $d_n$ is selected by multiplexer 15 in accordance with delay selection signal b to determine the delayed clock signal d.

The delay value of delayed clock signal d equals the delay value of unit delay circuit 14 multiplied by the value of the delay selection signal b. The delay value may be, for example, between zero and the half period of reference clock signal e inclusive.

As illustrated in FIG. 4, an inverted signal $\bar{e}$ of reference clock signal e and delayed clock signal d output from multiplexer 15 are supplied to input terminals of NAND gate 16 to generate an output signal $P_0$. The output signal $P_0$ is supplied to input terminal $I_0$ of two-input multiplexer 18 and when gate selection signal c (i.e., the strobe signal S) supplied to logic gate circuit 13 is low, the signal $P_0$ is output.

Reference clock signal e and delayed clock signal d are supplied to AND gate 17 to generate an output signal $P_1$. Output signal $P_1$ is coupled to input terminal $I_1$ of multiplexer 18. When strobe signal S is high, output signal $P_1$ forms the PWM output. In the PWM circuit according to the present invention constructed as above, a pulse width of high density can be produced regardless of a clock frequency without requiring a counter and comparator, thereby simplifying circuit structure. Therefore, gate selection signal c determines whether the pulse width is increased, for example, by as much as half of reference clock signal e in logic gate section 13.

Accordingly, it is an object of the present invention to provide a pulse width modulation (PWM) circuit for smoothly adjusting a produced pulse width by use of a controllable delay element to generate a pulse of high density while simplifying the circuitry by removing a counter and a comparator.

It will be apparent to those skilled in the art that various modifications and variations can be made in the pulse width modulation circuit of the present invention without departing from the spirit or scope of the invention. Thus, it is intended that the present invention cover the modifications and variations of this invention provided they come within the scope of the appended claims and their equivalents.

What is claimed is:

1. A pulse width modulation circuit comprising:
   a data register for generating a data pulse signal including a first selection signal and a second selection signal;
   a delay signal generator for processing a clock signal to generate a delayed clock signal in accordance with the first selection signal; and
   a logic gate circuit for processing the clock signal and the delayed clock signal to generate an adjustable pulse width modulation data signal in accordance with the second selection signal.

2. The pulse width modulation circuit as claimed in claim 1, wherein the delay signal generator comprises:
   a unit delay circuit for sequentially delaying the clock signal N-times to generate an output; and
   a delay signal selector for processing the output of the unit delay circuit to generate the delayed clock signal in accordance with the first selection signal.

3. The pulse width modulation circuit as claimed in claim 2, wherein the delay signal selector comprises an (n+1)X1 multiplexer.

4. The pulse width modulation circuit as claimed in claim 1, wherein the logic gate circuit comprises:
   a first logic gate for processing an inverted clock signal and the delayed clock signal;
   a second logic gate for processing the clock signal and the delayed clock signal; and
   a gate selector for processing outputs of the first and second logic gates to generate the pulse width modulation data signal in accordance with the second selection signal.

5. The pulse width modulation circuit as claimed in claim 4, wherein the first logic gate comprises a NAND gate.

6. The pulse width modulation circuit as claimed in claim 4, wherein the second logic gate comprises an AND gate.

7. The pulse width modulation circuit as claimed in claim 4, wherein the gate selector comprises a 2×1 multiplexer.

8. The pulse width modulation circuit as claimed in claim 1, wherein a pulse width of high density is produced regardless of any frequency of the clock signal.

9. A pulse width modulation circuit comprising:
   a data register for outputting a first control signal and a second control signal;
   a delay signal generator for delaying a clock signal for a period selectively determined by the first control signal to generate a delayed clock signal; and
   an adjustable logic gate circuit for generating a pulse width modulated signal from the clock signal, the delayed clock signal, and the second control signal.

10. The pulse width modulation circuit as claimed in claim 9, wherein the delay signal generator comprises:
    a unit delay circuit for sequentially delaying the clock signal n-times to generate a plurality of delay signals; and
    a delay signal selector, responsive to the first control signal, for selectively outputting one of said plurality of delay signals as the delayed clock signal.

11. The pulse width modulation circuit as claimed in claim 10, wherein the delay signal selector comprises an (n+1)X1 multiplexer.

12. The pulse width modulation circuit as claimed in claim 9, wherein the logic gate circuit comprises:
- a first logic circuit, having a first input for receiving an inverted clock signal and a second input for receiving the delayed clock signal, for generating a first output signal;
- a second logic circuit, having a first input for receiving the clock signal and a second input for receiving the delayed clock signal, for generating a second output signal; and
- a selector circuit, responsive to the second control signal, for selectively outputting one of the first output signal and the second output signal as the pulse width modulated signal.

13. The pulse width modulation circuit as claimed in claim 12, wherein the selector circuit comprises a 2×1 multiplexer.

14. The pulse width modulation circuit as claimed in claim 13, wherein the first logic circuit comprises a NAND gate.

15. The pulse width modulation circuit as claimed in claim 14, wherein the second logic circuit comprises an AND gate.

16. A pulse width modulation circuit comprising:
- a data register for generating a data pulse signal including a first selection signal and a second selection signal;
- an unit delay circuit for sequentially delaying a clock signal n-times to generate an output;
- an (n+1)×1 multiplexer for processing the output of the unit delay circuit to generate a delayed clock signal in accordance with the first selection signal; and
- a logic gate circuit for processing the clock signal and the delayed clock signal to generate an adjustable pulse width modulation data signal in accordance with the second selection signal.

17. The pulse width modulation circuit as claimed in claim 16, wherein the logic gate circuit comprises:
- a first logic circuit, having a first input for receiving an inverted clock signal and a second input for receiving the delayed clock signal, for generating a first output signal;
- a second logic circuit, having a first input for receiving the clock signal and a second input for receiving the delayed clock signal, for generating a second output signal; and
- a selector circuit, responsive to the second selection signal, for selectively outputting one of the first output signal and the second output signal as the pulse width modulation data signal.

18. The pulse width modulation circuit as claimed in claim 17, wherein the selector circuit comprises a 2×1 multiplexer.

19. A pulse width modulation circuit comprising:
- a data register with a pulse width data value stored therein for generating a first selection signal and a second selection signal, wherein the second selection signal is a most significant bit of the pulse width data value and the first selection signal is the remaining bits of the pulse width data value;
- a delay signal generator for processing a clock signal to generate a delayed clock signal in accordance with the first selection signal; and
- a logic gate circuit for processing the clock signal and the delayed clock signal to generate an adjustable pulse width modulation data signal in accordance with the second selection signal.

20. The pulse width modulation circuit as claimed in claim 19, wherein the delay signal generator comprises:
- a plurality of unit delay circuits for sequentially delaying the clock signal n-times to generate a plurality of delayed clock signals; and
- a delay signal selector for selecting one of the plurality of delayed clock signals in accordance with the first selection signal.

* * * * *